US011169177B2

(12) United States Patent
Lyding et al.

(10) Patent No.: US 11,169,177 B2
(45) Date of Patent: Nov. 9, 2021

(54) SCANNING PROBE AND ELECTRON MICROSCOPE PROBES AND THEIR MANUFACTURE

(71) Applicant: Tiptek, LLC, West Chester, PA (US)

(72) Inventors: Joseph W. Lyding, Champaign, IL (US); Gregory S. Girolami, Urbana, IL (US); Scott P. Lockledge, West Chester, PA (US); Jinju Lee, Champaign, IL (US)

(73) Assignee: Tiptek, LLC, West Chester, PA (US)

( * ) Notice: Subject to any disclaimer, the term of this patent is extended or adjusted under 35 U.S.C. 154(b) by 0 days.

(21) Appl. No.: 16/327,827

(22) PCT Filed: Aug. 9, 2017

(86) PCT No.: PCT/US2017/046000
§ 371 (c)(1),
(2) Date: Feb. 24, 2019

(87) PCT Pub. No.: WO2018/031602
PCT Pub. Date: Feb. 15, 2018

(65) Prior Publication Data
US 2019/0219611 A1     Jul. 18, 2019

Related U.S. Application Data

(63) Continuation-in-part of application No. 15/235,889, filed on Aug. 12, 2016, now Pat. No. 10,060,948.

(51) Int. Cl.
*G01Q 70/10* (2010.01)
*G01Q 60/00* (2010.01)
*G01Q 60/16* (2010.01)
*G01Q 70/16* (2010.01)
*H01J 37/28* (2006.01)

(52) U.S. Cl.
CPC ........... *G01Q 70/10* (2013.01); *G01Q 60/00* (2013.01); *G01Q 60/16* (2013.01); *G01Q 70/16* (2013.01); *H01J 37/28* (2013.01)

(58) Field of Classification Search
USPC .......................................................... 850/21
See application file for complete search history.

(56) References Cited

U.S. PATENT DOCUMENTS

| 5,164,595 | A | 11/1992 | Musselman et al. | |
|---|---|---|---|---|
| 5,393,647 | A * | 2/1995 | Neukermans | G01Q 70/16 430/320 |
| 5,578,745 | A * | 11/1996 | Bayer | G01Q 40/02 73/1.73 |
| 6,329,214 | B1 | 12/2001 | Hattori et al. | |
| 6,470,738 | B2 | 10/2002 | Narita et al. | |
| 6,797,952 | B2 * | 9/2004 | Kaito | G01Q 60/14 850/26 |
| 6,864,481 | B2 * | 3/2005 | Kaito | G01Q 70/12 250/306 |
| 7,783,383 | B2 * | 8/2010 | Eliuk | B01F 13/1055 700/245 |
| 8,070,920 | B2 * | 12/2011 | Lyding | B82Y 35/00 204/192.34 |
| 8,349,519 | B2 * | 1/2013 | Sato | H01M 4/8657 429/523 |
| 8,621,660 | B2 | 12/2013 | Watanabe et al. | |
| 8,819,861 | B2 | 8/2014 | Lyding et al. | |
| 8,966,661 | B2 | 2/2015 | Chang et al. | |
| 9,773,634 | B2 | 9/2017 | Kozakai et al. | |
| 10,060,948 | B2 | 8/2018 | Lyding et al. | |
| 2004/0256577 | A1 | 12/2004 | Stevens et al. | |
| 2009/0106869 | A1 | 4/2009 | Park et al. | |
| 2009/0297422 | A1 | 12/2009 | Zuo et al. | |
| 2012/0080596 | A1 * | 4/2012 | Vandervorst | H01J 37/285 250/307 |
| 2018/0328960 | A1 | 11/2018 | Lyding et al. | |

FOREIGN PATENT DOCUMENTS

| CN | 101788571 B | 3/2014 |
|---|---|---|
| CN | 103869103 B | 6/2014 |
| CN | 104345178 A | 2/2015 |
| CN | 103018492 B | 4/2015 |
| CN | 103439533 B | 7/2015 |
| JP | H0644618 B2 | 2/1994 |
| JP | 2005300442 A | 10/2005 |
| JP | 2007256045 A | 10/2007 |

OTHER PUBLICATIONS

Zhang, "Preparation of sharp polycrystalline tungsten tips for scanning tunneling microscopy imaging", J. Vac. Sci. Technol. B 14(1), Jan/Feb. 1996, pp. 1-10 (Year: 1996).*
Biegelsen, D.K et al., "Ion milled tips for scanning tunneling microscopy," Appl. Phys. Lett., Mar. 16, 1987, vol. 50, No. 11, 696-698.
Biegelsen, F.A., "Simple ion milling preparation of (111) tungsten tips", Appl. Phys. Lett., Mar. 27, 1989, vol. 54, No. 13, 1223-1225.
Hoffrogge, P. et al., "Nanostructuring of tips for scanning probe microscopy by ion sputtering: Control of the apex ratio and the tip radius," J. Appl. Phys. (2001), vol. 90, No. 10, 5322-5327.
Jayaraman, Sreenivas et al., "Hafnium diboride thin films by chemical vapor deposition from a single source precursor," J. Vac. Sci. Technol., A 23 (6), 1619-1625, (2005) https://doi.org/101116/1.2049307.

(Continued)

*Primary Examiner* — Phillip A Johnston
(74) *Attorney, Agent, or Firm* — Frank Rosenberg

(57) ABSTRACT

Methods are described for the economical manufacture of Scanning Probe and Electron Microscope (SPEM) probe tips. In this method, multiple wires are mounted on a stage and ion milled simultaneously while the stage and mounted probes are tilted at a selected angle relative to the ion source and rotated. The resulting probes are also described. The method provides sets of highly uniform probe tips having controllable properties for stable and accurate scanning probe and electron microscope (EM) measurements.

21 Claims, 7 Drawing Sheets

(56) References Cited

OTHER PUBLICATIONS

Jensen. James A. et al., "Titanium, Zirconium, and Hafnium Tetrahydroborates as "Tailored" CVD Precursors for Metal Diboride Thin Films", J. Am Chern. Soc., (1988), 110, 5, 1643-44.
Lisovskii et al., "Sintered Metals and Alloys: Cemented Carbides Alloyed with Ruthenium, Osmium, and Rhenium", Powder Metallurgy and Metal Ceramics, vol. 39, No. 9-10, 2000.
Mahmud et al., "Ultra-Sharpening of Diamond Stylus by 500 eV O+/O2+ Ion Beam Machining without Facet and Ripple Formation", Int. J. Nanosci. Nanotechnol., Sep. 2012, pp. 127-134, vol. 8, No. 3.
Sigmund, Peter, "Elements of Sputtering Theory", PSP Review vol. Apr. 13, 2011, Pan Stafford Publishing, 10.1201/b13726.
Wei et al., "Angular dependence of sputtering yield of amorphous and polycrystalline materials", J. Phys. D: Appl. Phys (2008), 172002, pp. 1-4., vol. 41.
Zhang et al., "Preparation of sharp polycrystalline tungsten tips for scanning tunneling microscopy imaging," J. Vac. Sci. Technol. B 14 (1) 1 (1996) pp. 1-10, doi: 10.116/1.58902910.
International Search Report for International Application No. PCTUS1746000 dated Jan. 18, 2018.
Written Opinion for International Application No. PCTUS1746000 dated Jan. 18, 2018.
Vasile, M. J., et al. "Scanning probe tips formed by focused ion beams." Review of scientific instruments 62.9 (1991) 2167-2171.
Lee, Eric D. "Parallel Plasma Field Directed Sputter Sharpening of Field Emitters." (2009) (Year: 2009).
Gao et al. "Interaction of deuterium plasma with sputter-deposited tungsten ntride films", Nuclear Fusion, 2016, artcle article 016004, International Atomic Energy Agency, European Atomic Energy Community, UK, IOP Publishing.
Gao et al. "Influence of nitrogen pre-implantation on deuterium retention in tungsten", Physica Scripta, 2014, article 014021, The Royal Swedish Academy of Sciences, European Atomic Energy Community, UK, IOP Publishing.
Lee et al. "The influence of nitrogen on deuterium permeation through tungsten", Physica Scripta, 2014, article 014021, The Royal Swedish Academy of Sciences, UK, IOP Publishing.
Phadke et al., "Sputtering and nitridation of transition metal surfaces under low energy, steady state nitrogen ion bombardment". Applied Surface Science, 2020, vol. 505, article 144529, Elsevier B.V.
Plank et al., "Study of the temperature-dependent nitrogen retention in tungsten surfaces using X-ray photoelectron spectroscopy", Nuclear Materials and Energy, 2018, vol. 17, pp. 48-55, Elsevier Ltd.
Rezeq et al., "Tungsten nanotip fabrication by spatially controlled field-assisten reaction with nitrogen", J. Chem. Phys. 124, 204716 (2006), American Institute of Physics, AIP Publishing.
Extended European Search Report for EP Application No. EP 17 84 0173 dated Mar. 9, 2020.
Schmucker et al. "Field-directed sputter sharpening for tailored probe materials and atomic-scale lithography." Nature communications 3 (2012): 935 (Year: 2012).
Ottaviano et al., "Scanning Auger microscopy study of W tips for scanning tunneling microscopy." Review of Scientific Instruments 74, 3368 (2003).
Parazzo et al., "Effects of HF attack on the surface and interface microchemistry of W tips for use in the STM microscope: a scanning Auger microscopy (SAM) study." Vacuum 52 (1999) 421-426.
Kar et al., "A reverse electrochemical floating-layer technique of SPM tip preparation." Measurement Science and Technology 11.10 (2000): 1426 (Year: 2000).
First Office Action for Taiwanese Application No. TW 106127074, dated Mar. 17, 2021.
Translation of First Office Action for Taiwanese Application No. TW 106127074.
Final Office Action for U.S. Appl. No. 16/041,731, dated Jan. 28, 2021.
First Office Action for Chinese Patent Application No. CN 201780062675, dated Jul. 12, 2021.
Machine Translation of First Office Action for Chinese Patent Application No. CN 201780062675.
First Search for Chinese Patent Application No. CN 201780062675, dated Jul. 6, 2021.
Winters et al.. Influence of Surface Absorption Characteristics on Reactively Sputtered Films Grown in the Biased and Unbiased Modes, Journal of Applied Physics 43, 794 (1972).
Machine translation of description of Japanese Patent No. JPH0644618A.
Machine translation of description of Chinese Patent Publication No. CN104345178A.
Machine translation of description of Chinese Patent No. CN103869103B.
Machine translation of description of Japanese Patent Publication No. JP2007256045A5.
Machine translation of description of Chinese Patent No. CN103439533B.
Machine translation of description of Chinese Patent No. CN103018492B.
Machine translation of description of Chinese Patent No. CN101788571B.
Machine translation of description of Japanese Patent Publicaton No. JP2005300442A.
Office Action for European Patent Application No. EP 17840173.3, dated Aug. 11, 2021.

\* cited by examiner

SCANNING PROBE AND ELECTRON MICROSCOPE PROBES AND THEIR MANUFACTURE

RELATED APPLICATIONS

This application is a national stage filing and claims the priority benefit of PCT/US2017/046000 filed Aug. 9, 2017 and also claims priority to U.S. patent application Ser. No. 15/235,889, filed Aug. 12, 2016.

INTRODUCTION

For accurate and stable imaging, Scanning Probe and Electron Microscopy (SPEM) requires probes that are hard, often electrically-conductive and provide a single, sharp, tip. Such probes are typically made by electrochemical etching or polishing and the resulting etched or polished probes may be subjected to subsequent processing. In particular, several publications have described the use of ion milling at inclined angles with respect to the tip axis, combined with rotation of the tips, as part of a process to form SPEM probes. Such "tilt and rotate" prior art, however, suffers from one or several limitations, such as (1) incompatibility with a batch process capable of processing many probes at once, or (2) inferior geometry due to insufficiently sharp and or poorly shaped tips.

For example, Hoffrogge et al. in "Nanostructuring of tips for scanning probe microscopy by ion sputtering: Control of the apex ratio and the tip radius," J. Appl. Phys. 90, 5322 (2001) describe ion milling of previously chemically etched tungsten tips, in which the probes are rotated about their axes during milling (although the rotation speed is not specified). The authors state that by "variation of the angle between the ion beam and the macroscopic tip, the tip angle can be controlled in the range between 12° and 35°." Hoffrogge et al. define the ion angle (alpha) to be the angle between the rotation axis of the tip and the axis of the ion beam. They state that "the apex ratio is usually defined as the ratio of the tip diameter at a distance of 0.5 μm from the very tip to that distance; it can be used to characterize the back part of the tip instead of the tip angle." In other words apex ratio=(width as measured 0.5 μm back from the tip)/(0.5 μm). An equivalent parameter to describe the back part of the tip is the cone angle (also known as the taper angle or tip angle), which is related to the apex ratio by the formula cone angle=2 arctan(apex ratio/2). Thus if apex ratio=0.2, then cone angle=11.4°; if apex ratio=0.65, then cone angle=36°. Hoffrogge et al. report that: "To obtain a small apex ratio of 0.2, an ion angle of about 90° or more is required . . . . At small ion angles, the apex ratio is rather large with values of about 0.65 or even more. A reduction of the original tip radius occurs under almost all conditions. After a bombardment time depending on the specific conditions used, the tip reaches its final shape, i.e., further bombardment does not change the shape of the foremost part of the tip." Thus, Hoffrogge et al. teach that apex angles of 0.2 (i.e., cone angles close to 11°) can be obtained only if the ion angle is 90° or more. In other words, the ion beam must approach the tip from below the tip. They also mention "It is important to perform the experimental work under clean vacuum conditions. Hydrocarbon contamination on the electrochemically etched crude tip can have a significant influence on the final shape because carbon has a very low sputter yield, thus a carbon layer can serve as a 'shield' against sputtering of the metallic tip. After ion sputtering, the surfaces are clean and highly reactive. The tips have to be stored and handled properly to avoid contamination and reactive processes like oxidation before their use."

Biegelsen et al. in "Ion milled tips for scanning tunneling microscopy," discuss ion milling of tungsten tips that were rotated at 2 rpm. "A beam of 4-5 keV Ar+ incident at an angle alpha=0-40° below the horizon[tal] irradiated the tip (gun current ca. 0.4 mA)." Their FIG. 3 shows that their alpha angle corresponds to an ion angle (as defined by Hoffrogge et al.) of 90 to 130°. See Appl. Phys. Lett. 50, 696 (1987) and Appl. Phys. Lett. 54, 1223 (1989). As was the case for Hoffrogge, Biegelsen et al. teach that the sharpest tips are obtained if the ion beam approaches the tip from below the probe.

Both Hoffrogge and Biegelsen teach methods that suffer from a significant limitation, which is that they are incompatible with batch processing, whereby dozens or even hundreds of probes mounted on a stage are processed simultaneously in the same ion beam. This is because the stage used to maintain a plurality of probes in the beam cross section will necessarily serve as a physical obstacle to the ion beam that approaches the tips from below, and thus will prevent the beam from reaching the probes or milling the probes uniformly. In contrast to the methods of Hoffrogge and Biegelsen, in the invention described below, the ion beam approaches the tip from above the tip (ion angle of less than 90°). This alternative geometry readily accommodates integration into a batch processing mode in which all the probes experience approximately the same amount of milling.

Zhang and Ivey in "Preparation of sharp polycrystalline tungsten tips for scanning tunneling microscopy imaging," J. Vac. Sci. Technol. B 14(1) (1996) describe a technique for making STM tips. The authors stated that the purpose of their article was "to fabricate STM tips from W by electrochemical polishing and a combination of electrochemical polishing and ion milling" and that "Fabrication parameters [were] optimized in an effort to produce the sharpest, most reproducible tips." Initially, a polycrystalline W wire was electrochemically etched in a sodium hydroxide solution to form a neck in the wire that severs to produce a tip and the etched wire was removed from solution. The wire was then rotated and exposed to a flux of 4.5 keV Ar ions at an incidence angle of 30° (corresponding to an ion angle of 60°) and a current density of about 1 mA/cm$^2$ for 40 minutes. These optimized conditions were reported to reduce tip radius to 20 nm and cone angle was reduced from 35° to 25°. Longer milling times are reported to result in blunter tips and multiple tips. Zhang et al. reported that "Parameters such as voltage and current density affect thinning time, while incidence angle affects cone angle," and that "For longer milling times, blunter tips or even multiple tips can form, which has been reported previously."

In order to sharpen a tip and reduce the radius or curvature, more material must be removed from the sides than from the tip apex. Zhang et al. achieves this by ion milling at an incident angle 30° from the plane that is perpendicular to the rotation axis in a flux of 4.5 KeV Ar ions. Both experimental data (Sigmund 2011) and sputter yield theory (Wei 2008) indicate that normalized sputter yield increases as the energy of the incident ion increases, over a broad range of angle of incidences, indicating that an ion of higher energy would remove a greater number of substrate atoms from the sides than one at lower energy at a given angle using the conditions of Zhang et al. Therefore, the conventional wisdom would have predicted that use of ions of lower energy than the 4500 eV used by Zhang and/or use of current densities smaller than the 1 mA/cm² used by Zhang would lead to blunter tips with a diameter of curvature greater than the 40 nm seen by Zhang. Surprisingly and unexpectedly, we find that sharper tips and smaller diameters of curvature (<35 nm) are found at such lower ion energies and/or lower current densities.

Another method to sharpen probe tips is called field-directed sputter sharpening (Lyding and Schmucker, U.S. Pat. Nos. 8,070,920 and 8,819,861). In this method, ionized atoms are directed towards the apex of a previously sharpened conducting probe, which is maintained at an electric potential difference relative to the surrounding vacuum chamber, which is electrically grounded). The sign of the charge on the ions is the same as the sign of the electric potential difference. Application of this electric potential to the tip generates an electric field around the tip, with the strength of the field varying inversely with the tip diameter of curvature. Because the electric field surrounding the tip is non-uniform and dependent on the tip form, the flow of ions is modified by the shape of the tip apex. This results in a selective repulsion of ions from the tip apex and a modification of the angle at which ions impact the tip. As sharpening proceeds, the apex diameter of curvature is further reduced, which further increases the local electric field strength and enhances the sharpening effect. In contrast, the current invention does not require the application of an electric potential difference to the probe.

SUMMARY OF THE INVENTION

In a first aspect, the invention provides a method of making SPEM probes, comprising: mounting a plurality of wire pieces to a rotatable stage; rotating the stage with mounted wire pieces and simultaneously milling the wires with an ion beam having an ion energy in the range of 1 to 3500 eV to produce the probe tips mounted to the stage; wherein the rotating stage has an axis of rotation; wherein the angle between the axis of rotation and the ion beam is from 5 to 70°; where the angle is defined with respect to the axis of rotation such that 0° is defined to be the angle if the ion beam originates from directly above the stage and is parallel to the axis of rotation. In some embodiments, the invention includes one or any combination of the following characteristics: the ion beam comprises neon, argon, xenon, krypton, hydrogen, oxygen, nitrogen, methane or acetylene ions or mixtures thereof; the angle between the axis of rotation and the ion beam is from 15 to 65°; the angle between the axis of rotation and the ion beam is from 45 to 65°; the wire pieces mounted to stage may or may not be subjected to electropolishing prior to milling; the plurality of wire pieces are tungsten wires; the plurality of wire pieces comprise a material selected from the group consisting of beryllium copper (Be—Cu) alloy, platinum (Pt), iridium (Jr), platinum-iridium (Pt—Ir) alloy, tungsten (W), tungsten-rhenium (W—Re) alloy, palladium (Pd), palladium alloy, gold (Au), and commercial alloys (NewTek™, Paliney 7™ (Pd along with small percentages of Ag, Au, Pt, Cu, and Zn), Paliney H3C and Paliney C (Pd alloys with Pd, Ag, and Cu)); the plurality of wire pieces comprise a coating of titanium nitride, tungsten carbide, or hafnium diboride ($HfB_2$); further comprising a broad beam ion source, having a beam diameter of 1 to 100 cm, that generates the ion beam; comprising an evacuation chamber housing the ion beam, stage and plurality of wires; where the plurality of wires comprises a batch of 5 to 10,000 wire pieces; where the stage is rotated at a rate of 0.01 to 100 rpm or 1 to 100 rpm; where the ion beam has an ion energy in the range of 100 eV to 3500 eV; where the ion flux from the source is in the range of $10^{14}$ to $10^{17}$ ions/cm²s; where the ion beam has an ion energy in the range of 50 eV to 2000 eV or 1000 eV to 2000 eV; wherein the ion beam is conducted with a current density of 0.016 to 16 mA/cm² or 0.2 to 0.8 mA/cm²; and where the exposure to the ion beam is conducted for 0.5 minutes to 30 minutes, or 30 minutes to 120 minutes or for 60 to 120 minutes; and/or where, at the end of the exposure, the wires are removed from the stage and wherein at least 70%, or at least 80%, or at least 90% of the individual probes have the following features:

a single tip on each probe body having cone angles of 5° to 30°, and a diameter of curvature in the range of 15 to 30 nm.

The invention also includes a batch of SPEM probes made by the inventive methods.

In another aspect, the invention provides a SPEM probe or batch of SPEM probes, wherein each SPEM probe comprises: a rod (preferably a cylindrical rod) having a thickness (thickness is defined as the longest dimension perpendicular to length, where length is the longest dimension, and typically the rod is a cylinder and thus thickness=diameter) in the range of 1 to 2000 μm, and comprising a single tip at one end; a probe tip that is substantially oxide free as characterized by having less than 5 nm of oxide as imaged by TEM; wherein the probe tip has: a cone angle of 5 to 45°; and a diameter of curvature of 1 to 35 nm. The SPEM probe, or each probe within the batch, further comprises a shape described by at least one of the following:

wherein a silhouette of the probe has a tip that can be described by a sphere with the diameter of curvature of the tip apex; wherein the silhouette has a longitudinal axis that corresponds to the longitudinal axis of the probe; and wherein two straight line segments of equal length can be drawn, each of which is tangent to this sphere, and intersect the silhouette at two points with one point on either side of the silhouette opposite the same length on the longitudinal axis of the probe, and wherein the thickness of the silhouette increases monotonically from the two tangent points to the two intersection points and the edge of the silhouette lies farther from the tip longitudinal axis than the two straight line segments at every point along the edge of the silhouette from the tip apex to each of the two intersection points, no matter what length straight line segments are chosen (or wherein the straight line segments are drawn to intersect the probe silhouette at 1 μm, or 100 nm, or 50 nm down the longitudinal axis of the probe from the tip apex); or wherein a silhouette of the probe conforms to a profile f(x) described by the functional form:

$$f(x)=a_0+a_1x+a_2x^2+a_3x^3+b_1x^{1/2}+b_2x^{1/3},$$

where f(x) is the distance of the surface of the probe from the longitudinal axis of the probe, measured along a line perpendicular to the longitudinal axis, the coefficients $a_0$, $a_1$, $a_2$, $a_3$, $b_1$, $b_2$ are real numbers, and x is the distance in nm that ranges from 0 to L, with 0 being the longitudinal axis position where the probe profile is tangent to the probe apex sphere, where $a_0$ is in the range of 1 to 50 nm, where $a_1$ is 0 or is in the range 0.2 to 4, where $a_2$ is 0 or is in the range of 0.004 to 0.08 $nm^{-1}$, where $a_3$ is 0 or in the range of 0.00008 to 0.0016 $nm^{-2}$, where $b_1$ is 0 or in the range of 1.4 to 28 $nm^{1/2}$, and where $b_2$ is 0 or in the range of 2.7 to 54 $nm^{2/3}$; or a shape defined by two arcs of a circle, each arc being tangent to one of a pair of opposing parallel sides of a cylindrical wire body wherein the two arcs are defined by a circle having a radius equal to between 1 and 20 times (in some embodiments between 5 and 7 times) the wire body diameter D, and wherein the two arcs meet at the tip apex; or a biconic shape wherein, with reference to FIG. 9, $L_2 > L_1$; $L_1/L$ is in the range of 0.05 to 0.4 or 0.1 to 0.3; $\phi_1/\phi_2$ is in the range of 1.1 to 2.0, or 1.2 to 1.8, or 1.1 to 1.3; $R_1$ is in the range of 10 to 1 µm or 20 to 200 nm; and L is in the range of 30 nm to 1 µm or 50 nm to 500 nm, or 50 nm to 100 nm; and $R_2$ is in the range 1 to 2000 µm, or 250 to 1000 µm; or a shape defined by a power series wherein, with reference to FIG. 10, the shape is within the area encompassed by rotating a curve $y=R(x/L)^n$ about an x-axis defining the longitudinal probe axis, where n is in the range of 0.6 to 0.9 or 0.7 to 0.8; or a shape defined by a Haack series wherein, with reference to FIG. 11, where $y=[R(\theta-\frac{1}{2}\sin 2\theta + C\sin^3\theta)^{1/2}]/\pi^{1/2}$; where $\theta=\arccos(1-2x/L)$; where C is in the range of 0.00 to 0.667 or 0.0 to 0.3.

In some embodiments, the invention includes one or any combination of the following characteristics: comprising a batch of SPEM probes mounted on a stage; wherein each SPEM tip has a cone angle in the range of 9 to 15°; wherein each SPEM tip has a diameter of curvature of 1 to 10 nm; wherein each SPEM probe comprises a cylindrical rod having a rod diameter in the range of 250 to 500 µm; and/or wherein the probes have striations indicative of ion milling.

Probes made according the claimed invention, or probes as described herein, can be used in the semiconductor industry for nanoprobing and/or atomic force probing. Atomic force probing is a well-known technique for failure analysis and quality control in the manufacture of integrated circuits. This technique may include generating high resolution atomic force microscopy (AFM) topography images, conductive AFM, scanning capacitance, and electrostatic force microscopy images. Conductive AFM provides pico-amp resolution to identify and localize electrical failures such as shorts, opens, resistive contacts and leakage paths, enabling accurate probe positioning for current-voltage measurements. AFM based nanoprobers enable nanometer scale device defect localization and accurate transistor device characterization without the physical damage and electrical bias induced by high energy electron beam exposure. See https://en.wikipedia.org/wiki/Nanoprobing. Probes made according to the claimed invention, and probes as described herein, can be used in the semiconductor industry in a scanning electron microscope (SEM)-based nanoprobing system. This system comprises a SEM and one or more probes in a device that precisely moves and places the probes onto nanometer-sized features on the semiconductor surface. Electrical testing may then be performed via these instruments. One such SEM system is the nProber™ built by Thermo Fischer Scientific Corporation. It provides electrical fault localization and characterization of transistors and may be used to localize a variety of electrical faults prior to extracting thin sectional samples for physical failure analysis in a transmission electron microscope (TEM).

In various embodiments, the invention may provide advantages, including one or more of the following: increased efficiency of manufacturing with less waste of probe material; less oxygen and, in general, fewer impurities as compared to conventional processes; greater uniformity; better performance during SPEM operation; superior probe geometry, and faster manufacturing speed per probe with fewer steps.

Glossary:

"Cone angle," also known as taper angle or tip angle, is illustrated in FIG. 2. Usually the cone angle is clear from an electron micrograph image of a probe. For purposes of heightened clarity, in the present invention, it is the interior angle at the tip that characterizes a triangle drawn between the tip and the sides of the probe at points 1.5 µm back from tip (where the 1.5 µm refers to the distance along the central axis of the probe to the tip).

"Ion source," in the methods of the invention, is a source (for example, a plasma) that generates ions. A flux (or flow) of ions may be obtained when the ions from the ion source are accelerated to form a beam. A variety of ions are known to those skilled in the art. A homogeneous ion source may be generated by a Kaufman ion source, which is a plasma generation device with multi-aperture grid set on one end. The typical ion optics construction consists of two grids, one called the screen grid and the other called the accelerator grid. The ions generated in the plasma discharge chamber are extracted from the plasma and accelerated through the apertures of the grids. The accelerated ions from each aperture will overlap to form a broad ion beam. Several centimeters downstream of the grids, an electron source injects low energy electrons into the beam to create a charge neutralized beam. In addition to these components, the typical construction of a Kaufman source consists of a filament cathode, metal anode, and a permanent magnet assembly whose magnetic field exists between the cathode and anode. Its operation can be described as follows: the filament cathode thermionically emits electrons, which impact a neutral atom or molecule from a working gas fed into discharge chamber. This results in ionization and a high density plasma in the discharge chamber. The plasma is elevated to a positive potential with respect to ground by the biased anode. When a negative bias is applied to the accelerator grid, an electric field is established which extracts ions from the plasma discharge. The extracted ions flow through the grid apertures on their way to form an ion beam. Other ion sources are available, including but not limited to gridless End-Hall eH Sources, and gridded radio frequency inductive coupled plasma (RFICP) ion sources.

"Ion angle" is the angle between the axis of the ion beam and the axis of a rotating probe. Ion angles less than 90° correspond to the ion beam approaching the probe tip from above the tip.

"Probe" refers to the entire wire piece.

"Probe apex," indicates the end of the point.

"Probe tip" indicates a region from the probe apex to a distance, such as 500 nm or another specified distance, away from the probe apex along the probe's longitudinal axis.

"Diameter of curvature" is typically determined by measuring the diameter of the largest circle that fits into the tip adjacent to the apex of a probe as shown in FIG. 3. The radius is half of the diameter. The tip dimensions are taken from an electron micrograph image of the probe tip. In cases where it is not clearly apparent, or where there is a reasonable dispute, the diameter of curvature is to be obtained by the method of Watanabe et al., U.S. Pat. No. 8,621,660, incorporated herein by reference.

Scanning probe and electron microscope (SPEM) probe. SPEM probes are used in a device to interact with a surface. Examples include, but are not limited to nanoprobers used in semiconductor circuit failure analysis, scanning probe microscopes such as scanning tunneling microscopes or atomic force microscopes, or any device wherein a probe tip interacts with a surface.

The phrase "tips that are substantially oxide free as characterized by having less than 5 nm of oxide as imaged by TEM" refers only to the section of the probe that is within 500 nm of the apex. An example of a tip where oxide is present is shown in FIG. 4, while a tip that is substantially oxide free is shown in FIG. 5. The thickness of the oxide coating can be seen in the TEM microphotograph.

As is standard patent terminology, the term "comprising" means "including" and does not exclude additional components. Any of the inventive aspects described in conjunction with the term "comprising" also include narrower embodiments in which the term "comprising" is replaced by the narrower terms "consisting essentially of" or "consisting of." As used in this specification, the terms "includes" or "including" should not be read as limiting the invention but, rather, listing exemplary components.

DETAILED DESCRIPTION

Figure 1:
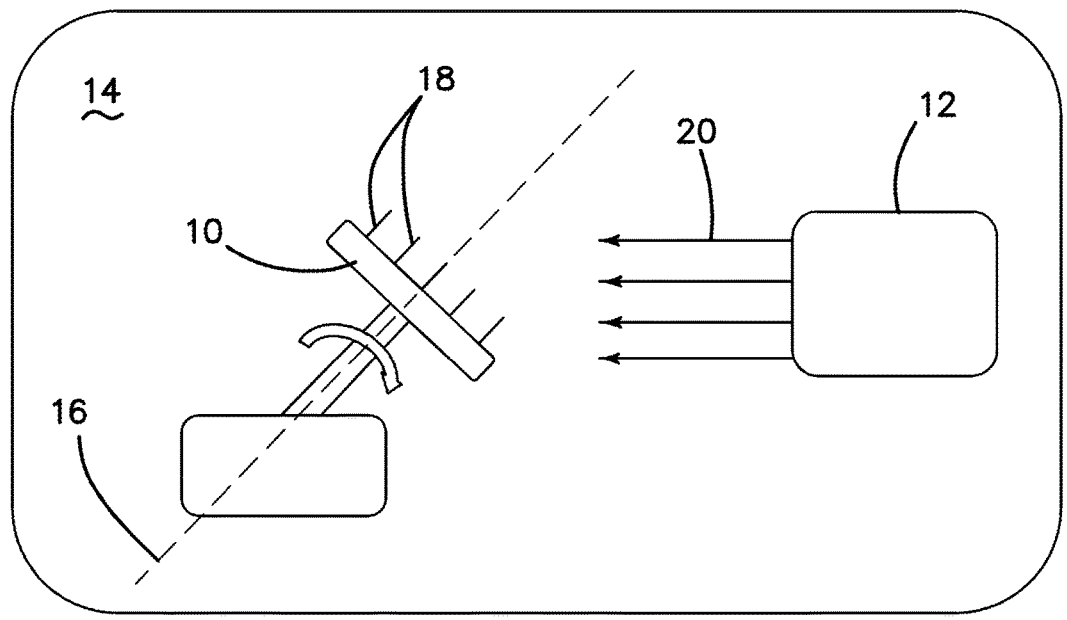
FIG. 1 is a schematic illustration of the inventive process.

The SPEM probe is manufactured from a piece of wire (defined as a material having a length to diameter ratio of at least 5, preferably at least 10, more typically at least 100 or, in some embodiments, in the range of 10 to 1000). Wire pieces for the starting materials preferably have a diameter between 0.15 mm and 1.00 mm and a length in the range of 0.5 to 3 cm, more preferably 1.5 to 2.5 cm and are etched or machined to a point. The probe materials may be any of the materials conventionally used for SPEM probes. Thus, in preferred embodiments, the probe comprises a material selected from the group consisting of beryllium copper (Be—Cu) alloy, platinum (Pt), iridium (Jr), platinum-iridium (Pt—Ir) alloy, tungsten (W), tungsten-rhenium (W—Re) alloy, palladium (Pd), palladium alloy, gold (Au), and commercial alloys (NewTek™, Paliney 7™ (Pd along with small percentages of Ag, Au, Pt, Cu, and Zn), Paliney H3C and Paliney C (Pd alloys with Pd, Ag, and Cu)), and cemented metal carbides, borides or nitrides, such as tungsten (W), titanium (Ti), niobium(Ni), or tantalum (Ta) carbide cemented with cobalt (Co), nickel (Ni), iron (Fe), chromium (Cr), molybdenum (Mo), platinum (Pt), iridium (Jr), rhodium (Rh), palladium (Pd), rhenium (Re), ruthenium (Ru), and osmium (Os), or mixtures thereof. A preferred list of probe body materials comprises tungsten, platinum iridium, and tungsten carbide cemented with cobalt, nickel, or mixtures of cobalt and nickel. These materials may be used by themselves or with a coating of one or more layers such as polytetrafluoroethylene (PTFE); magnetic coatings, such as iron, cobalt, chromium or platinum alloys; diamond; diamond-like-carbon (DLC), Ag; Au; C; boron nitride; silicon nitride; silicon dioxide; metal oxides, such as aluminum oxide; metal nitrides, such as titanium nitride or aluminum titanium nitride; metal carbides, such as tungsten carbide; metal borides such as hafnium diboride ($HfB_2$) or titanium diboride; metal carbonitrides, such as titanium carbonitride; ceramics; or other hard coatings, such those containing chromium. Suitable methods for applying such coatings are known in the literature; for example, in Jensen et al., J. Am. Chem. Soc. 110, 1643-44 (1988); Jayaraman et al., J. Vac. Sci. Technol. 23, 1619 (2005); and Jayaraman et al., Surface & Coatings Technol. 200, 6629-6633 (2006), all of which are incorporated herein by reference. We have prepared SPEM probes from W and Pt—Ir having the advantageous properties of cone angle and diameter of curvature discussed in this description. We have also prepared SPEM probes with $HfB_2$ coatings having the discussed advantageous properties. The inventive method may also utilize non-conductive wires, in some embodiments selected from the group consisting of diamond, diamond-like carbon, silicon, undoped silicon, metal oxides such as alumina or zirconia, silicon dioxide, silicon carbide, silicon nitride, boron nitride, boron carbide, glass, cementitious materials, plastics, rubber, silicon rubber, organic polymers and resins such as phenolic, epoxide, polyisocyanurate, polyurethane, ethylene propylene diene monomer rubber (EPDM), polyimide, polyvinyl chloride, polystyrene, polyether ether ketone (PEEK), polypropylene (PP), polyethylene terephthalate (PET), polyethercsulfone (PES), polyethylene imine (PEI), ethylene-chlorotrifluroethlyene polymer (ECTFE), polybutylene terephthalate (PBT), polytetrafluoroethylene (PTFE) and fluorinated ethylene propylene polymer (FEP), fiberglass, cellulose, mineral (rock or slag), mica, porcelain, clay, aluminosilicate, wood, cotton, ceramic, paper, fiber glass composites, plastic fibers, and natural fibers, and combinations thereof. A preferred list of nonconductive wire materials includes diamond, zirconia, silicon carbide, and silicon nitride. The materials listed above are believed to behave similarly under the ion milling conditions described in this description and likewise are believed to result in similar finished SPEM probes.

Before processing the wire pieces according to the inventive method, the wire pieces may be pre-sharpened by known methods. Preferably, this is done by electrochemical etching by a technique such as that described by Zhang et al., which is referenced above. Typically, a coating, if present, is applied after the electrochemical etch. The coating can be applied either before or after the ion milling process described here, and $HfB_2$ coatings have been applied after the ion milling such that little or no additional sharpening is needed.

Figure 2:
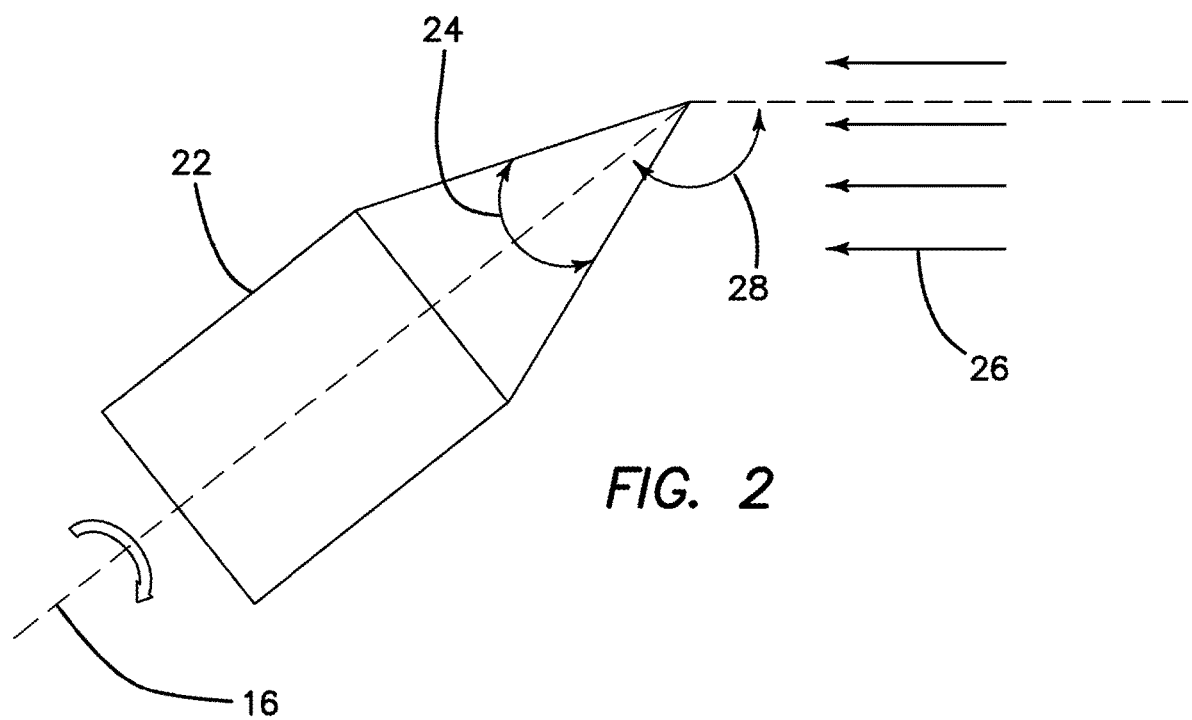
FIG. 2 shows angles in the process.
Figure 3:
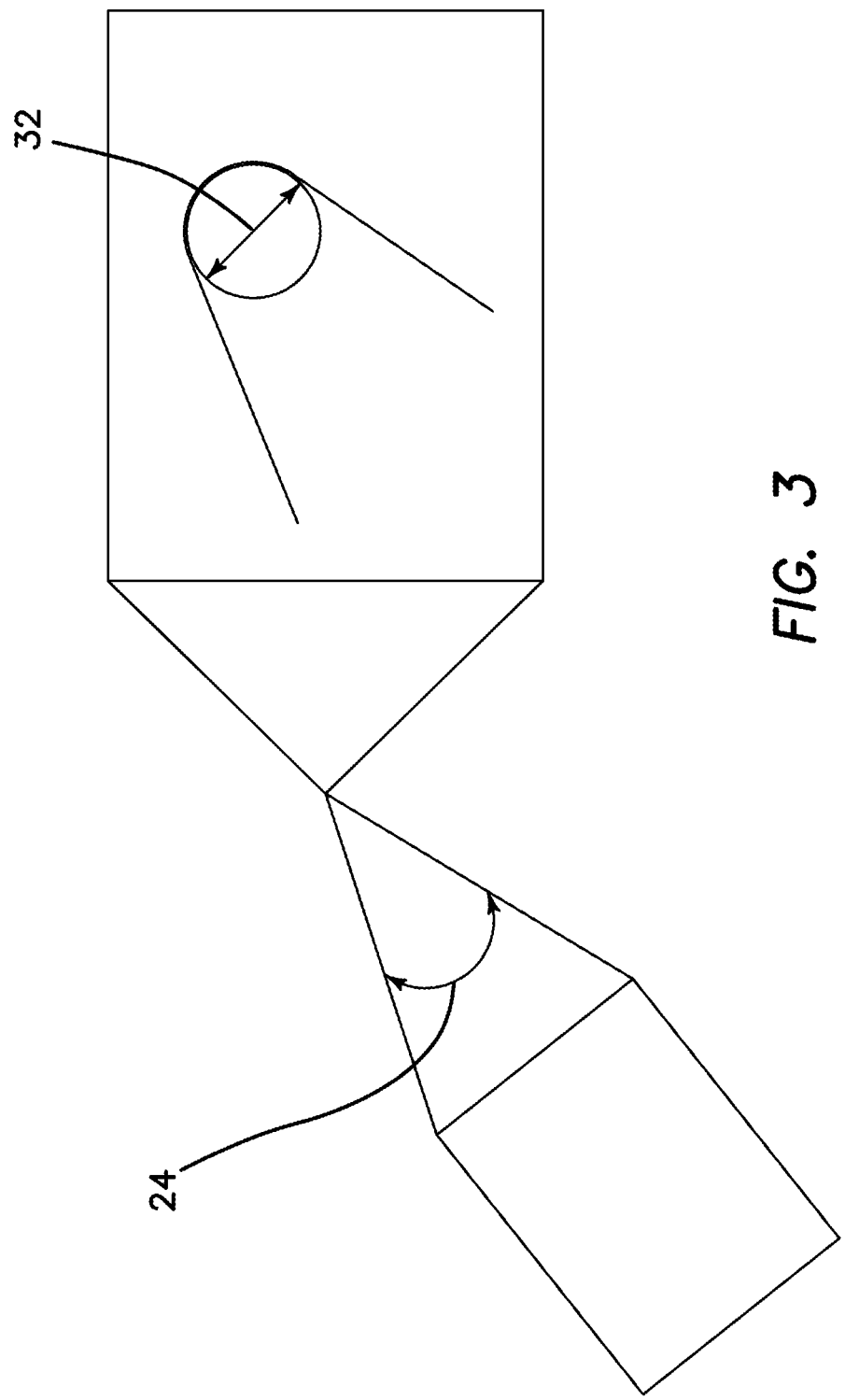
FIG. 3 illustrates the cone angle and diameter or curvature of the SPEM probe.
Figure 4:
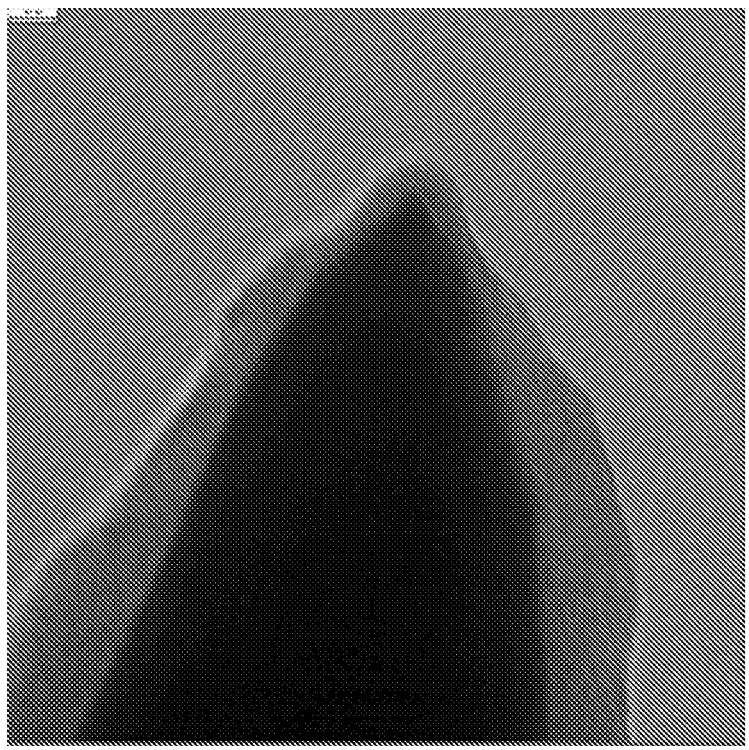
FIG. 4 illustrates a tip (dark, central tip) having an oxide coating (seen as a lighter coating). The small rectangular bar in the left hand corner is a scale showing the length of 10 nm.
Figure 5:
FIG. 5 illustrates a tip (dark, central tip) without an oxide coating. The small rectangular bar in the left hand corner is a scale showing the length of 10 nm.
Figure 6:
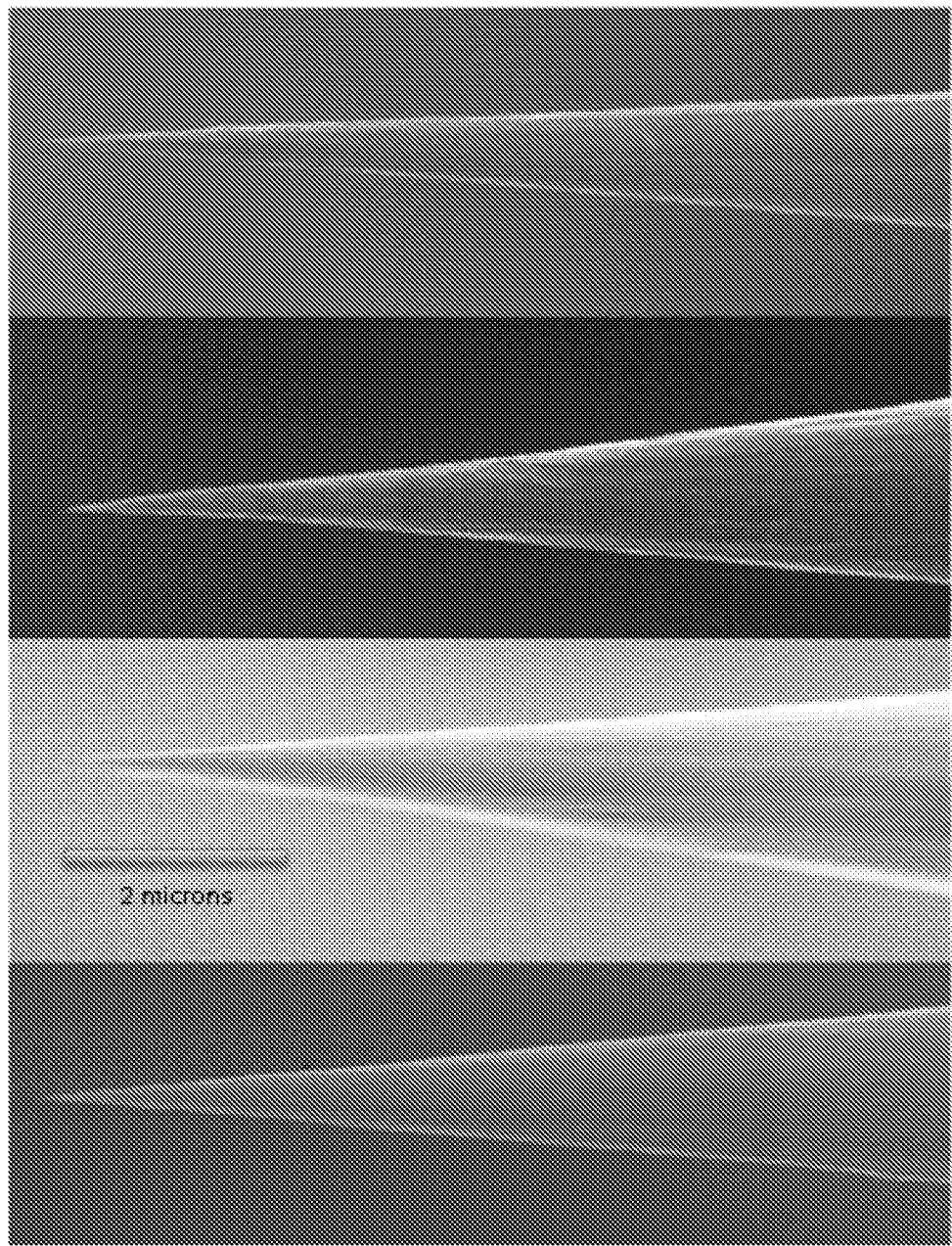
FIG. 6 shows four representative examples of probes after ion milling. Striations can be seen on the surface of these probes parallel to their longitudinal axis. They appear after exposure to an impinging beam of Ar ions.

A schematic view of the inventive process is illustrated in FIGS. 1-3. A batch of wire pieces 18 is fixed onto a stage 10 (also called a support). A "batch" of wire pieces (or SPEM probes) refers to a group of 5 to 10,000; preferably 10 to 1000 wire pieces. The stage is then rotated around a central axis 16 that is perpendicular to the top surface of the stage 10, typically at a rate of at least 0.01 revolution per minute (rpm), preferably in the range of 1 to 100 rpm, in some embodiments in the range of 50 to 70 rpm. Typically, the wire pieces in a batch are arranged in a circular or square array, and the long axes of the wire pieces 18 are approximately parallel with the central axis of rotation 16 of the stage 10. The stage 10 and ion beam 20 are disposed within evacuation chamber 14. The entire batch of wires should be exposed to the broad ion beam 20 generated by broad beam ion source 12. Thus, the size of the rotating array of wires (square or other shape) should be enveloped by the size of the ion beam 20. In some preferred embodiments, the ion beam has a circular area (perpendicular to the beam direction 26) with a diameter of 5 to 50 cm, in some embodiments 5 to 20 cm. The ion flux from the source is in the range of $10^{14}$ to $10^{17}$ ions/cm$^2$s. The ions are preferably obtained from neon, argon, xenon, or krypton gases, or mixtures of these gases. In addition to the inert gases, hydrogen, oxygen, and nitrogen can be used individually, in combination with each other and/or in combination with neon, argon, or krypton, for ion processing. Gases such as methane or acetylene can be used to modify the surface properties. Preferably, the ion beam is made up of Ar ions. Neutral Ar atoms may also be present as chamber background pressure used to operate the ion source. Also, electrons may be present as a means of collimating the ion beam and to enable processing of non-conducting samples by preventing charge buildup from the ions. The angle 28 between the direction of incident ion beam and axis of rotation is known as the ion angle, which may be set in the range of 5° to 90°, preferably 10° to 70°, preferably 15° to 65°, in some embodiments 15 to 25°, and in some embodiments 45° to 55°. The ion beam is set to an ion energy in the range of 100 eV to 3500 eV; preferably 200 eV to 3000 eV, more preferably 500 eV to 2500 eV, in some embodiments in the range of 1000 eV to 2000 eV, and in a specific embodiment about 1500 eV. The exposure to the ion beam is preferably conducted with a current density of 0.1 to 1 mA/cm$^2$, more preferably from 0.2 to 0.8 mA/cm$^2$, still more preferably from 0.4 to 0.6 mA/cm$^2$. In preferred embodiments, the time for exposure can be for 20 to 120 minutes; preferably for 30 to 90 minutes; or 60 minutes to 120 minutes; or more than 120 minutes; and may be for about 60 minutes. However, these times could be about two orders of magnitude shorter for ion fluxes in the $10^{17}$ ions/cm$^2$s range. In some embodiments, the angle 28 is changed one or more times during the milling process; for example, starting with a relatively large angle to quickly remove material from the wire and moving to more oblique incident angles to control the shape of the probe. In other embodiments, the angle may also be moved continuously during the milling process.

Another advantage of the present invention is that it is self-limiting. The probe arrives at a final shape for a given angle, and then, while the tips continue to be exposed to the ion source, the probe shortens but maintains the same shape during prolonged milling.

When the milling is complete, the ion beam exposure is stopped and the wires are removed from the stage. The resulting probes comprise a probe body 22 and a tip characterizable by a cone angle 24 (also called taper angle or tip angle) and diameter of curvature 32. There should be a single tip on each probe body 22 since multiple tips on a probe results in inferior properties. Typically, the probes have striations, which are indicative of ion milling. The probe tips preferably have cone angles of 5° to 45°, more preferably in the range of 5° to 30°, still more preferably in the range of 5° to 15°, and still more preferably in the range of 9° to 15°. The diameter of curvature is preferably in the range of 1 to 35 nm; in some embodiments in the range of 5 to 35 nm, or 10 to 35 nm, or 15 to 30 nm. In some embodiments, the tip is substantially oxide free. These unique and novel properties are enabled by the methods of the present invention. These properties, or any selected combination of these properties (including, in some preferred embodiments, any of the shape characteristics described below), are present on individual probes and are preferably present on all or at least 80% or at least 90% of a batch.

In general, this technique creates tips that are substantially cylindrically symmetrical about the tip axis. Some degree of asymmetry is tolerable, but the most useful tips are those that are reasonably symmetrical, as could be judged by a person experienced with working with SPEM probes. The properties of SPEM probes can be measured by electron microscopy, typically transmission electron microscopy (TEM).

In an embodiment, the sample holder for field directed sputter sharpening is adapted to hold the longitudinal axis of the conductor to be sharpened at a selected angle (for example a predetermined angle with respect to the longitudinal axis of an ion beam). In an embodiment, the ion acceleration voltage is between about 550 eV and 5 keV and the voltage applied to the conductor is ten volts or more and preferably 100 V or more.

The processing conditions described above can be combined with the field directed sputter sharpening (FDSS) method, in which an electrical potential difference, either positive or negative, is applied to the tip so as to modify the flow of ions around the tip. FDSS is described by Lyding and Schmucker in U.S. Pat. Nos. 8,070,920 and 8,819,861 which are incorporated herein as if reproduced in full. The difference between the ion accelerating voltage and the tip voltage is sufficiently large that sputtering of the tip occurs, but not so large that the influence of the tip voltage is negligible. The directed sputtering in FDSS cannot be used to produce the bullet shape that is characteristic of preferred embodiments of the present invention, but FDSS may be utilized where sharper tips are needed. In FDSS, it is necessary that the probes be electrically conductive and a potential is applied to the probe. In contrast to FDSS, the present invention can be operated in the absence of a potential applied to the wires; in other words, the stage (including mounted wires) can be grounded during the sputtering process. In addition, in contrast to FDSS, the present invention can be performed upon nonconductive probes.

The ability of a probe to image on the nanometer scale and also be mechanically robust depends on both the diameter of curvature of the tip and also the shape of the probe near the tip. If the cone angle of the near-tip region is too small, the probe will be mechanically too flexible to be useful for applications in which the probe must be placed in contact with the surface. If the cone angle of the near-tip region is too large, the probe will not be suitable for applications in which more than one probe is used simultaneously in close proximity to one another. One example of a technique that requires both a mechanically robust probe and that involves the use of multiple probes in close proximity is fault testing of microelectronic circuits. For such applications, it is advantageous for the near-tip region of the probe to have not only a cone angle within a certain specific range, but also a convex or "bullet shape" One of the features of the current invention is that a probe with bullet shape can be obtained.

The methods of the present invention enable the production of tips in which the near apex region of the tip has a different geometry than the cone-like geometry typically seen. The near apex region is defined as the portion of the probe between the apex and a distance L from the apex along the longitudinal axis of the probe. In one embodiment L is 1 micrometer. In another embodiment, L is 100 nm, and in a further embodiment L is 50 nm.

The following sections provide mathematical descriptions of the geometry of the probes near the apex. In all cases, the shape of a probe is measured by TEM; although some minor roughness may be observed on an atomic level; the shape is measured by disregarding or smoothing out the roughness/noise as is typically observed by TEM.

Figure 7:
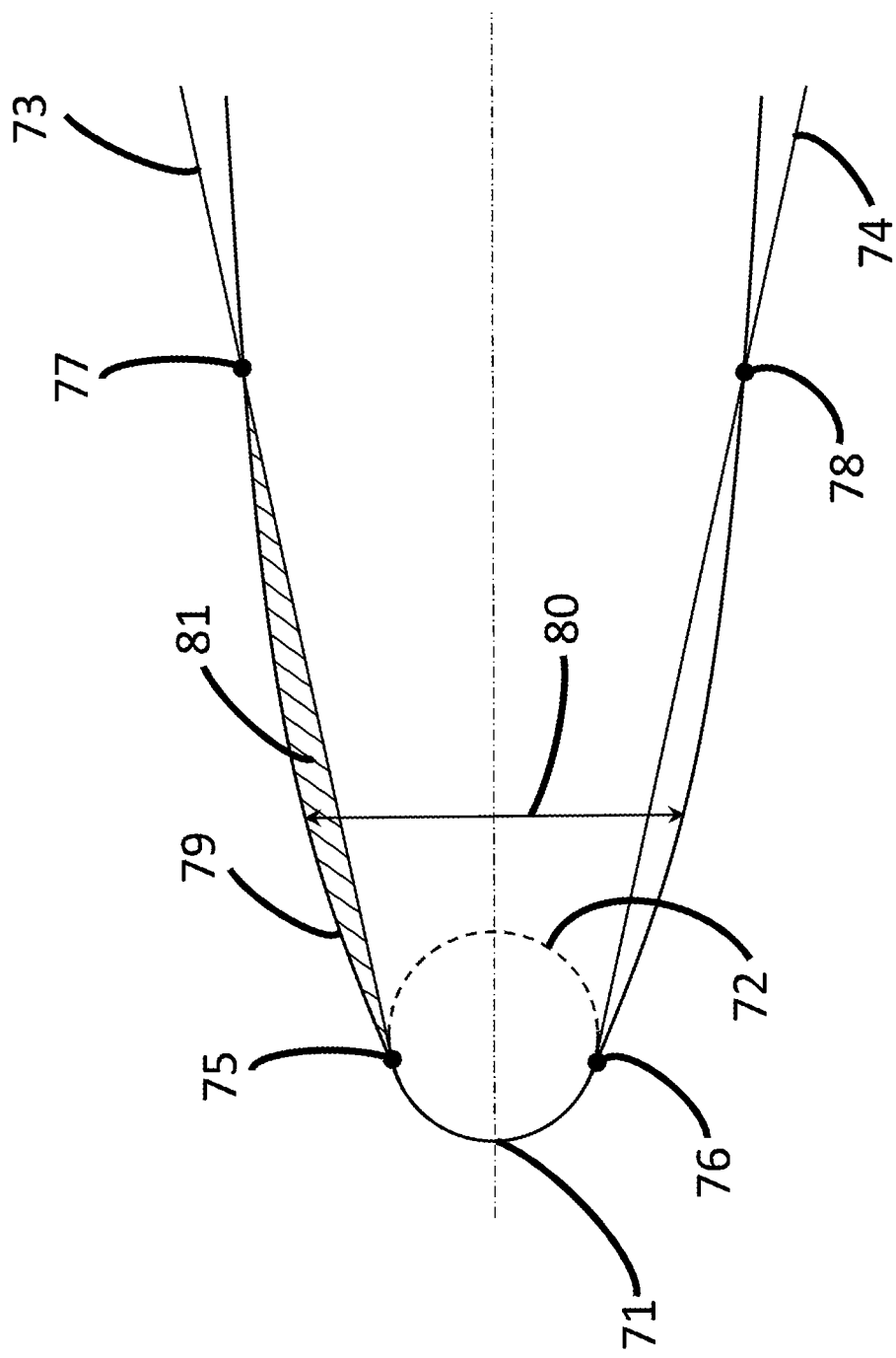
FIG. 7 is a diagram showing a bullet shaped probe.

An electron microscopy image is obtained at a resolution of 10 nm or better, preferably at 1 nm. A silhouette of the tip is obtained from which two profiles can be obtained, one on either side of the silhouette. In embodiments relevant to the current invention, the silhouette is approximately bilaterally symmetric with respect to the longitudinal probe axis. The probe has a tip 71 that can be described by a sphere 72 with the diameter of curvature of the tip apex. Two straight line segments 73, 74 of equal length are drawn, each of which is tangent to this sphere at points 75 and 76, and which intersect at two points 77, 78, one on either side of the silhouette edge 79 (see FIG. 7). In some embodiments, the two straight line segments 73, 74 intersect the probe silhouette at 1 μm, 100 nm, or 50 nm along the longitudinal probe axis. If the thickness 80 of the probe silhouette increases monotonically from the tangent points 75, 76 to the two intersection points 77, 78, and the profile lies farther from the tip longitudinal axis than the two straight lines at every point between the tangent points to the tip and the two intersection points, no matter what length straight line segments are chosen, then the tip has a bullet shape. Shaded region 81 shows the area outside a cone.

The geometry of a probe from the tangent point where the probe profile meets the spherical end of the probe to a distance of L from the tangent point is often nearly or completely axially symmetric. In one embodiment, the geometry of the probe can conform to a profile f(x) that can be described by the functional form:

$$f(x)=a_0+a_1x+a_2x^2+a_3x^3+b_1x^{1/2}+b_2x^{1/3},$$

where f(x) is the distance of the surface of the probe from the longitudinal axis of the probe, measured along a line perpendicular to the longitudinal axis, the coefficients $a_0$, $a_1$, $a_2$, $a_3$, $b_1$, $b_2$ are real numbers that can be positive, negative or zero, and x is the distance that ranges from 0 to L, with 0 being the longitudinal axis position where the probe profile is tangent to the probe apex sphere. This functional form describes probes with near apex regions that can be cylindrical, conical, convex or concave in shape. In one embodiment of the bullet shaped probe, the probe region from 0 to L is parabolic in shape, which corresponds to $a_0$ and $b_1$ being non-zero and all the other coefficients being zero. The coefficient $a_0$ will typically have values in the range of 1 to 50 nm. The coefficient $a_1$ will typically either be 0 or have values in the range 0.2 to 4 if x is in nm. The coefficient $a_2$ will typically be 0 or have values in the range of 0.004 to 0.08 $nm^{-1}$ if x is in nm. The coefficient $a_3$ will typically be 0 or have values in the range of 0.00008 to 0.0016 $nm^{-2}$ if x is in nm. The coefficient $b_1$ will typically be 0 or have values in the range of 1.4 to 28 $nm^{1/2}$ if x is in nm. The coefficient $b_2$ will typically be 0 or have values in the range of 2.7 to 54 $nm^{2/3}$ if x is in nm.

Figure 8:
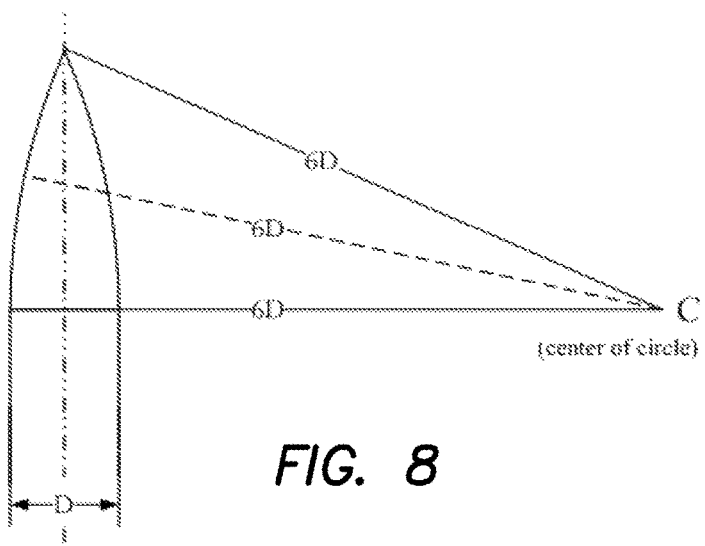
FIG. 8 shows the descriptive geometry of a probe with a bullet shape given by a tangent arc radius equal to 6 wire body diameters.

Another kind of bullet shape is defined in FIG. 8. In this embodiment, if the diameter of the cylindrical wire body is D, the profile of a bullet-shaped probe in the near apex region as defined above is described by two arcs of a circle of radius equal to a multiple of D, each arc being tangent to one of a pair of opposing parallel sides of the cylindrical wire body. In some embodiments, the two arcs are defined by a circle having a radius equal to between 1 and 20 times, preferably between 5 and 7 times the wire body diameter D. The two arcs meet at the apex of the probe. At this meeting point, the apex is defined by a diameter of curvature that in one embodiment is less than 10 nm. The two arcs may or may not be tangent at the point of intersection to the cylindrical portion of the wire. When the circles are tangent to the cylinder portion, this is a tangent shape. When the circles are not tangent to the cylinder portion, this is a secant shape.

In other embodiments, the probe tip has a biconic shape (see FIG. 9) wherein $L_2>L_1$; $L_1/L$ is in the range of 0.05 to 0.4 or 0.1 to 0.3; $\phi_1/\phi_2$ is in the range of 1.1 to 2.0, or 1.2 to 1.8, or 1.1 to 1.3; $R_1$ is in the range of 10 to 1 μm or 20 to 200 nm; and L is in the range of 30 nm to 1 μm or 50 nm to 500 nm, or 50 nm to 100 nm; and $R_2$ is in the range 1 to 2000 μm, or 250 to 1000 μm. In this case, whether a given probe has this morphology is determined by dividing L into 5 equal parts and the points defining each part, beginning at the sharp end, forms a shape that falls within the claimed ranges.

Figure 10:
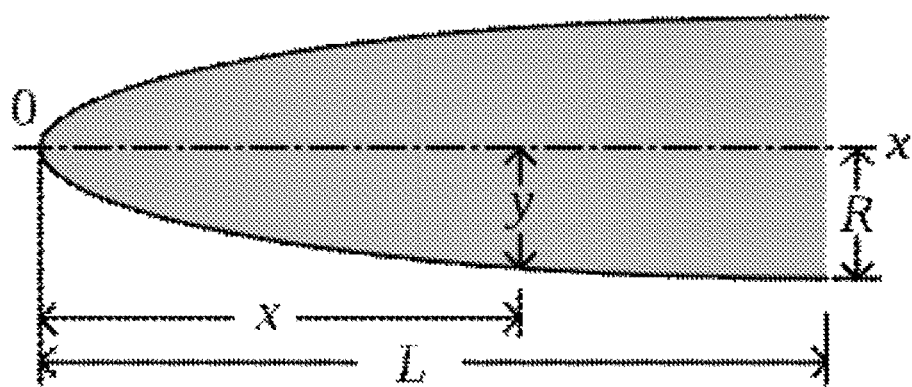
FIG. 10 illustrates the descriptive geometry of a probe with a shape given by rotating the curve y=R(x/L)^n about the x-axis.

In some embodiments, the probe tip has a shape generated by rotating the curve $y=R(x/L)^n$ about an x-axis defining the longitudinal probe axis, where R and L are defined as in the FIG. 10, and n is in the range of 0.6 to 0.9 or 0.7 to 0.8. In this case, whether a given probe has this morphology is determined by dividing L into 5 equal parts and the points defining each part, excluding the point at the sharp end, forms a shape that falls within the claimed ranges.

Figure 11:
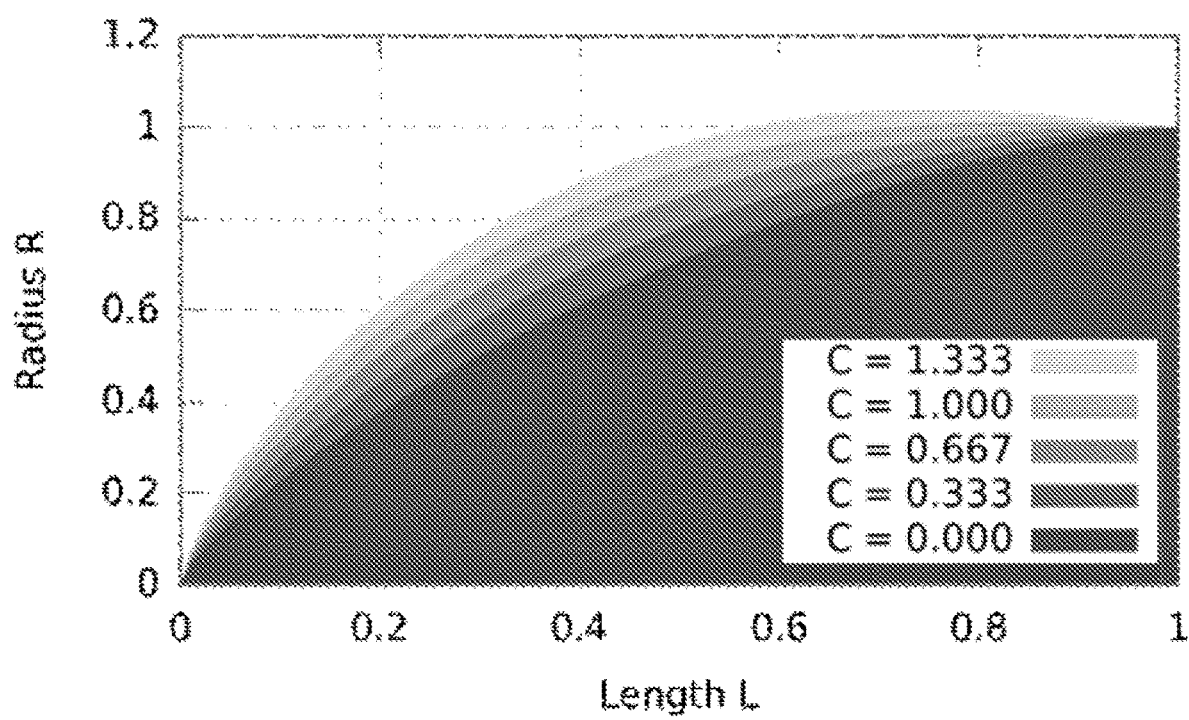
FIG. 11 illustrates the descriptive geometry of a probe with a shape given by the Haack series.

In some embodiments, the probe tip has a shape defined by the Haack series (see FIG. 11):
where $y=[R(\theta-\frac{1}{2}\sin 2\theta+C\sin^3\theta)^{1/2}]/\pi^{1/2}$
where $\theta=\arccos(1-2x/L)$
where C is in the range of 0.00 to 0.667 or 0.0 to 0.3
and where R, L, and x are defined as above.

EXAMPLES

Tungsten wire pieces of diameter between 0.15 mm and 1.00 mm and about 2 cm in length are etched to a point with a diameter of curvature of less than 100 nm using known procedures (see the previously cited Zhang et al.). These etched wire pieces are then secured onto a flat stage such that the long axes of the wires are perpendicular to the surface of the stage, with the tips pointing away from the stage surface. The stage is then attached to a rotation mechanism that is located inside an evacuation chamber as shown in FIG. 1. The stage is tilted so that the long axes of the wire pieces are oriented at a pre-specified angle, called the ion angle, ranging from 0 to 90° with respect to the incident argon ion beam. In another embodiment of the invention, the angle is varied during ion beam processing.

The broad beam ion source used was a Kaufman type source, which produces a nearly uniform ion beam across its exit aperture. The exit aperture is 10 cm in diameter. In addition to emitting ions, the source incorporates a neutralizer filament that thermionically emits electrons, which create space charge neutrality and prevent the ion beam from blooming. The tips to be sputtered were located about 30 cm from the exit aperture of the ion source. The ion energy range used with the source is 100 eV to 1500 eV and the ion beam current can range from 10 mA to 100 mA. These conditions correspond to a flux range from $7\times10^{14}$ ions/$cm^2$s to $7\times10^{15}$ ions/$cm^2$s.

Specific processing conditions used argon ions at an energy of 1500 eV and a flux of $3\times10^{15}$ ions/$cm^2$s. During ion processing, the sample holder is rotated on its axis at about 60 rpm, and the typical processing time is 60 minutes.

Figure 9:
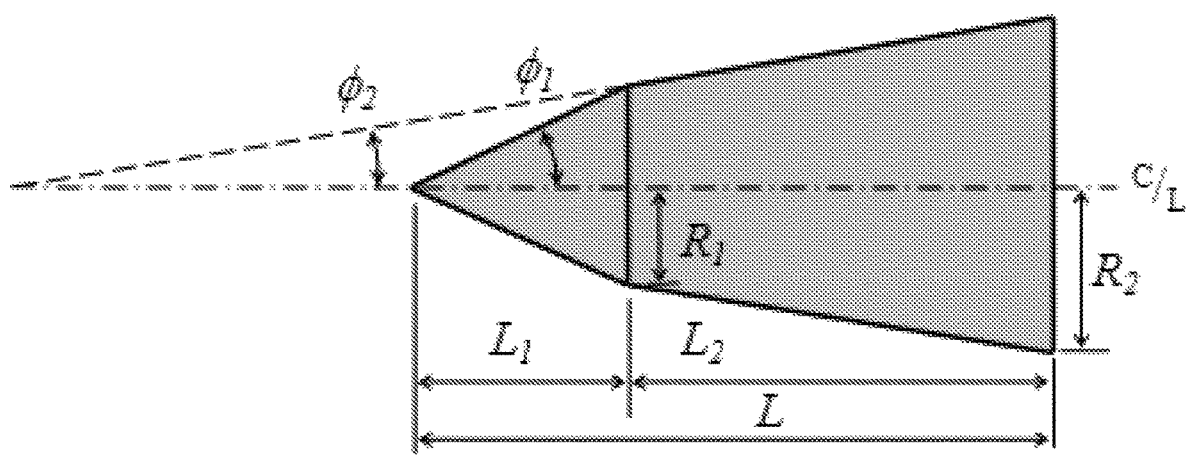
FIG. 9 illustrates the descriptive geometry of a probe with a biconic shape.

What is claimed:

1. A SPEM probe or batch of SPEM probes, wherein each SPEM probe comprises:
a rod having a thickness in the range of 1 to 2000 µm, and comprising a single tip at one end;
a probe tip that is substantially oxide free as characterized by having less than 5 nm of oxide as imaged by TEM; wherein the probe tip has: a cone angle of 5 to 45°; and a diameter of curvature of 1 to 35 nm; and further comprising a shape having at least one of the following morphologies:
wherein a silhouette of the probe has a tip that can be described by a sphere with the diameter of curvature of the tip apex; wherein the silhouette has a longitudinal axis that corresponds to the longitudinal axis of the probe; and wherein two straight line segments of equal length can be drawn, each of which is tangent to this sphere, and intersect the silhouette at two points with one point on either side of the silhouette opposite the same length on the longitudinal axis of the probe, and wherein the thickness of the silhouette increases monotonically from the two tangent points to the two intersection points and the edge of the silhouette lies farther from the tip longitudinal axis than the two straight line segments at every point along the edge of the silhouette from the tip apex to each of the two intersection points, no matter what length straight line segments are chosen (or wherein the straight line segments are drawn to intersect the probe silhouette at 1 µm, or 100 nm, or 50 nm down the longitudinal axis of the probe from the tip apex); or
wherein a silhouette of the probe conforms to a profile f(x) described by the functional form:

$$f(x)=a_0+a_1x+a_2x^2+a_3x^3+b_1x^{1/2}+b_2x^{1/3},$$

where f(x) is the distance of the surface of the probe from the longitudinal axis of the probe, measured along a line perpendicular to the longitudinal axis, the coefficients $a_0$, $a_1$, $a_2$, $a_3$, $b_1$, $b_2$ are real numbers, and x is the distance in nm that ranges from 0 to L, with 0 being the longitudinal axis position where the probe profile is tangent to the probe apex sphere, where $a_0$ is in the range of 1 to 50 nm, where $a_1$ is 0 or is in the range 0.2 to 4, where $a_2$ is 0 or is in the range of 0.004 to 0.08 $nm^{-1}$, where $a_3$ is 0 or in the range of 0.00008 to 0.0016 $nm^2$, where $b_1$ is 0 or in the range of 1.4 to 28 $nm^{1/2}$, and where $b_2$ is 0 or in the range of 2.7 to 54 $nm^{2/3}$; or
a shape defined by two arcs of a circle, each arc being tangent to one of a pair of opposing parallel sides of a cylindrical wire body wherein the two arcs are defined by a circle having a radius equal to between 1 and 20 times (in some embodiments between 5 and 7 times) the wire body diameter D, and wherein the two arcs meet at the tip apex; or
a biconic shape wherein, with reference to FIG. 9, $L_2>L_1$; $L_1/L$ is in the range of 0.05 to 0.4 or 0.1 to 0.3; $\phi_1/\phi_2$ is in the range of 1.1 to 2.0, or 1.2 to 1.8, or 1.1 to 1.3; $R_1$ is in the range of 10 to 1 µm or 20 to 200 nm; and L is in the range of 30 nm to 1 µm or 50 nm to 500 nm, or 50 nm to 100 nm; and $R_2$ is in the range 1 to 2000 µm, or 250 to 1000 µm; or
a shape defined by a power series wherein, with reference to FIG. 10, the shape is within the area encompassed by rotating a curve $y=R(x/L)^n$ about an x-axis defining the longitudinal probe axis, where n is in the range of 0.6 to 0.9 or 0.7 to 0.8; or
a shape defined by a Haack series wherein, with reference to FIG. 11, where $y=[R(\theta-\frac{1}{2}\sin 2\theta+C\sin^3\theta)^{1/2}]/\pi^{1/2}$; where $\theta=\arccos(1-2x/L)$; where C is in the range of 0.00 to 0.667 or 0.0 to 0.3.

2. The SPEM probe or batch of SPEM probes of claim 1 wherein a silhouette of the probe has a tip that can be described by a sphere with the diameter of curvature of the tip apex; wherein the silhouette has a longitudinal axis that corresponds to the longitudinal axis of the probe; and wherein two straight line segments of equal length can be drawn, each of which is tangent to this sphere, and end at two points with one point on either side of the silhouette opposite the same length on the longitudinal axis of the probe, and wherein the thickness of the silhouette increases monotonically from the tip apex to the two points and the edge of the silhouette lies farther from the tip longitudinal axis than the two straight line segments at every point along the edge of the silhouette from the tip apex to each of the two points, no matter what length straight line segments are chosen (or wherein the straight line segments are drawn to intersect the probe silhouette at 1 µm, or 100 nm, or 50 nm down the longitudinal axis of the probe from the tip apex).

3. The SPEM probe or batch of SPEM probes of claim 1, comprising a batch of SPEM probes mounted on a stage.

4. The batch of SPEM probes of claim 1, wherein each SPEM tip has a cone angle in the range of 9° to 15°.

5. The SPEM probe or batch of SPEM probes of claim 1, wherein each SPEM tip has a diameter of curvature of 1 to 10 nm.

6. The SPEM probe or batch of SPEM probes of claim 1, wherein each SPEM probe comprises a cylindrical rod having a rod diameter in the range of 250 to 500 µm.

7. The SPEM probe or batch of SPEM probes of claim 1, wherein the probes have striations indicative of ion milling.

8. A method of manufacturing or studying an integrated circuit comprising using the SPEM probe of claim 1 for nanoprobing or atomic force probing.

9. The method of claim 8 comprising using the probe for nanoprobing; wherein the step of nanoprobing comprises electrical testing.

10. The SPEM probe or batch of SPEM probes of claim 1, wherein a silhouette of the probe or each probe in the batch of probes conforms to a profile f(x) described by the functional form:

$$f(x)=a_0+a_1x+a_2x^2+a_3x^3+b_1x^{1/2}+b_2x^{1/3},$$

where f(x) is the distance of the surface of the probe from the longitudinal axis of the probe, measured along a line perpendicular to the longitudinal axis, the coefficients $a_0$, $a_1$, $a_2$, $a_3$, $b_1$, $b_2$ are real numbers, and x is the distance in nm that ranges from 0 to L, with 0 being the longitudinal axis position where the probe profile is tangent to the probe apex sphere, where $a_0$ is in the range of 1 to 50 nm, where $a_1$ is 0 or is in the range 0.2 to 4, where $a_2$ is 0 or is in the range of 0.004 to 0.08 $nm^{-1}$, where $a_3$ is 0 or in the range of 0.00008 to 0.0016 $nm^2$, where $b_1$ is 0 or in the range of 1.4 to 28 $nm^{1/2}$, and where $b_2$ is 0 or in the range of 2.7 to 54 $nm^{2/3}$.

11. The SPEM probe or batch of SPEM probes of claim 1, wherein the SPEM probe or each probe in the batch of probes comprises a shape defined by two arcs of a circle, each arc being tangent to one of a pair of opposing parallel sides of a cylindrical wire body wherein the two arcs are defined by a circle having a radius equal to between 1 and 20 times the wire body diameter D, and wherein the two arcs meet at the tip apex.

12. The SPEM probe or batch of SPEM probes of claim 1, wherein the SPEM probe or each probe in the batch of probes comprises a biconic shape wherein, with reference to FIG. 9, $L_2 > L_1$; $L_1/L$ is in the range of 0.05 to 0.4; $\phi_1/\phi_2$ is in the range of 1.1 to 2.0; $R_1$ is in the range of 10 nm to 1 µm; and L is in the range of 30 nm to 1 µm; and $R_2$ is in the range 1 to 2000 µm.

13. The SPEM probe or batch of SPEM probes of claim 1, wherein the SPEM probe or each probe in the batch of probes comprises a biconic shape wherein, with reference to FIG. 9, $L_2 > L_1$; $L_1/L$ is in the range of 0.1 to 0.3; $\phi_1/\phi_2$ is in the range of 1.2 to 1.8; $R_1$ is in the range of 20 to 200 nm; and L is in the range of 50 nm to 500 nm; and $R_2$ is in the range 250 nm to 1000 µm.

14. The SPEM probe or batch of SPEM probes of claim 13, wherein the SPEM probe or each probe in the batch of probes comprises a biconic shape wherein, with reference to FIG. 9, $L_2 > L_1$; $L_1/L$ is in the range of 0.1 to 0.3; $\phi_1/\phi_2$ is in the range of 1.2 to 1.8; $R_1$ is in the range of 10 nm to 1 µm; and L is in the range of 30 nm to 1 µm; and $R_2$ is in the range 250 nm to 1000 µm.

15. The SPEM probe or batch of SPEM probes of claim 1, wherein a silhouette of the probe or each probe in the batch of probes comprises a shape defined by a power series wherein, with reference to FIG. 10, the shape is within the area encompassed by rotating a curve $y=R(x/L)^n$ about an x-axis defining the longitudinal probe axis, where n is in the range of 0.6 to 0.9.

16. The SPEM probe or batch of SPEM probes of claim 1, wherein a silhouette of the probe or each probe in the batch of probes comprises a shape defined by a power series wherein, with reference to FIG. 10, the shape is within the area encompassed by rotating a curve $y=R(x/L)^n$ about an x-axis defining the longitudinal probe axis, where n is in the range of 0.7 to 0.8.

17. The SPEM probe or batch of SPEM probes of claim 1, wherein the SPEM probe or each probe in the batch of probes comprises a shape defined by a Haack series wherein, with reference to FIG. 11, where $y=[R(\theta-\frac{1}{2}\sin 2\theta+C\sin^3 \theta)^{1/2}]/\pi^{1/2}$; where $\theta=\arccos(1-2x/L)$; where C is in the range of 0.00 to 0.667.

18. The SPEM probe or batch of SPEM probes of claim 17, wherein the SPEM probe or each probe in the batch of probes comprises a shape defined by a Haack series wherein, with reference to FIG. 11, where $y=[R(\theta-\frac{1}{2}\sin 2\theta+C\sin^3 \theta)^{1/2}]/\pi^{1/2}$; where $\theta=\arccos(1-2x/L)$; where C is in the range of 0.0 to 0.3.

19. The SPEM probe or batch of SPEM probes of claim 2 wherein a silhouette of the probe has a tip that can be described by a sphere with the diameter of curvature of the tip apex; wherein the silhouette has a longitudinal axis that corresponds to the longitudinal axis of the probe; and wherein two straight line segments of equal length can be drawn, each of which is tangent to this sphere, and end at two points with one point on either side of the silhouette opposite the same length on the longitudinal axis of the probe, and wherein the thickness of the silhouette increases monotonically from the tip apex to the two points and the edge of the silhouette lies farther from the tip longitudinal axis than the two straight line segments at every point along the edge of the silhouette from the tip apex to each of the two points, no matter what length straight line segments are chosen.

20. The SPEM probe or batch of SPEM probes of claim 1 wherein a silhouette of the probe has a tip that can be described by a sphere with the diameter of curvature of the tip apex; wherein the silhouette has a longitudinal axis that corresponds to the longitudinal axis of the probe; and wherein two straight line segments of equal length can be drawn, each of which is tangent to this sphere, and end at two points with one point on either side of the silhouette opposite the same length on the longitudinal axis of the probe, and wherein the thickness of the silhouette increases monotonically from the tip apex to the two points and the edge of the silhouette lies farther from the tip longitudinal axis than the two straight line segments, wherein the straight line segments are drawn to intersect the probe silhouette at 1 µm, or 100 nm, or 50 nm down the longitudinal axis of the probe from the tip apex.

21. The SPEM probe or batch of SPEM probes of claim 1 wherein the rod comprises a material selected from the group consisting of beryllium copper (Be—Cu) alloy, platinum (Pt), iridium (Jr), platinum-iridium (Pt—Ir) alloy, tungsten (W), tungsten-rhenium (W—Re) alloy, palladium (Pd), palladium alloy, gold (Au), and commercial alloys (New-Tek™, Paliney 7™ (Pd along with small percentages of Ag, Au, Pt, Cu, and Zn), Paliney H3C and Paliney C (Pd alloys with Pd, Ag, and Cu)).

\* \* \* \* \*